(12) United States Patent
Schwind et al.

(10) Patent No.: US 7,544,523 B2
(45) Date of Patent: Jun. 9, 2009

(54) METHOD OF FABRICATING NANODEVICES

(75) Inventors: Gregory Schwind, Portland, OR (US); Gerald Magera, Hillsboro, OR (US); Lawrence Scipioni, Beaverton, OR (US)

(73) Assignee: FEI Company, Hillsboro, OR (US)

( * ) Notice: Subject to any disclaimer, the term of this patent is extended or adjusted under 35 U.S.C. 154(b) by 105 days.

(21) Appl. No.: 11/364,800

(22) Filed: Feb. 28, 2006

(65) Prior Publication Data
US 2007/0148991 A1 Jun. 28, 2007

Related U.S. Application Data (60) Provisional application No. 60/753,561, filed on Dec. 23, 2005.

(51) Int. Cl.
*H01L 21/00* (2006.01)
(52) U.S. Cl. .......... 438/20; 438/460; 438/462; 438/962; 977/742; 977/750; 977/752; 977/773; 977/745; 977/748; 977/856; 977/857; 313/309; 313/311; 313/310; 257/E39.001; 257/E39.002; 257/E51.038; 257/E51.04; 257/E29.096; 445/50; 445/51
(58) Field of Classification Search .......... 438/20, 438/460, 462, 962; 313/309, 311, 310; 977/742, 977/750, 752, 773, 856, 857, 745, 748; 257/E39.001, 257/E39.002, E51.038, E51.04, E29.096; 445/50, 51
See application file for complete search history.

(56) References Cited

U.S. PATENT DOCUMENTS

| 4,055,780 | A | * | 10/1977 | Kawai et al. ............. 313/346 R |
| 4,482,839 | A | * | 11/1984 | Wada et al. ............. 313/346 R |
| 6,074,896 | A | * | 6/2000 | Dando ........................ 438/114 |
| 6,346,189 | B1 | | 2/2002 | Dui et al. |
| 6,401,526 | B1 | * | 6/2002 | Dai et al. ...................... 73/105 |
| 6,838,297 | B2 | * | 1/2005 | Iwasaki et al. ................ 438/20 |
| 6,858,521 | B2 | | 2/2005 | Jin |
| 6,960,528 | B2 | | 11/2005 | Chen et al. |
| 7,094,679 | B1 | * | 8/2006 | Li et al. ....................... 438/618 |
| 7,276,389 | B2 | * | 10/2007 | Kim et al. ..................... 438/34 |
| 2002/0006489 | A1 | * | 1/2002 | Goth et al. ................. 428/36.9 |
| 2002/0024279 | A1 | * | 2/2002 | Simpson et al. ............. 313/309 |

(Continued)

FOREIGN PATENT DOCUMENTS

JP    2002097004 A   *   4/2002

(Continued)

OTHER PUBLICATIONS

Refractory Materials & Electron Sources Applied Physics Technologies.*

(Continued)

*Primary Examiner*—David Vu
*Assistant Examiner*—Brandon Fox
(74) *Attorney, Agent, or Firm*—Scheinberg & Griner, LLP; David Griner; Michael O. Scheinberg (57) ABSTRACT

A method of batch fabrication using established photolithographic techniques allowing nanoparticles or nanodevices to be fabricated and mounted into a macroscopic device in a repeatable, reliable manner suitable for large-scale mass production. Nanoparticles can be grown on macroscopic "modules" which can be easily manipulated and shaped to fit standard mounts in various devices.

35 Claims, 10 Drawing Sheets

U.S. PATENT DOCUMENTS

| | | | |
|---|---|---|---|
| 2002/0067489 A1* | 6/2002 | Thakur et al. | 356/600 |
| 2002/0084410 A1* | 7/2002 | Colbert et al. | 250/306 |
| 2004/0026629 A1* | 2/2004 | Fujieda et al. | 250/423 R |
| 2004/0036403 A1* | 2/2004 | Ono et al. | 313/311 |
| 2004/0043527 A1* | 3/2004 | Bradley et al. | 438/48 |
| 2004/0241896 A1* | 12/2004 | Zhou et al. | 438/48 |
| 2006/0076489 A1* | 4/2006 | Ohshima et al. | 250/310 |
| 2007/0224804 A1 | 9/2007 | Tiano et al. | |
| 2007/0256929 A1 | 11/2007 | Pinheiro | |

FOREIGN PATENT DOCUMENTS

| | | |
|---|---|---|
| WO | 2007018542 A1 * | 2/2007 |
| WO | WO2007018542 A * | 2/2007 |
| WO | WO 2007018542 A1 * | 2/2007 |

OTHER PUBLICATIONS

De Jonge: "Carbon Nanotube Electron Sources and Applications"; Phll. Trans. R. Soc. Lond.; A362; 2004; pp. 2239-2266.

Schwoebel; "Spindt Cathode Tip Processing to Enhance Emission Stability and High-Current Performance"; J. VacScl, Technol.; B21(1); Jan./Feb. 2003; pp. 433-435.

Yenlimez; "Wafer Scale Production of Carbon Nanotube Scanning Probe Tips for Atomic Force Microscopy"; Applied Physics Letters; vol. 80, No. 12; Mar. 25, 2002; pp. 2225-2227.

Teo; "Field Emission from Dense, Sparse, and Patterned Arrays of Carbon Nanofibers"; Applied Physics Letters; vol. 80, No. 11; Mar. 18, 2002; pp. 2011-2013.

Guillorn; "Operation of a Gated Field Emiter Using an Individual Carbon Nanofiber Cathode": Applied Physics Letters; vol. 79, No. 21; Nov. 19, 2001; pp. 3508-2508.

Wang; "Flat Panel Display Prototype Using Gated Carbon Nanotube Field Emitters"; Applied Physics Letters: vol. 78, No. 9; Feb. 26, 2001; pp. 1294-1296.

Ren; "Growth of a Single Frestanding Multiwall Carbon Nanotube on Each Nanonickel Dot": Applied Physics Letters; vol. 75, No. 823: Aug. 1999; pp. 1086-1088.

* cited by examiner

METHOD OF FABRICATING NANODEVICES

This application claims priority from U.S. Provisional Application No. 60/753,561 filed on Dec. 23, 2005, which is hereby incorporated by reference.

TECHNICAL FIELD OF THE INVENTION

The present invention relates to nanofabrication and, in particular, to a method of mass-producing nanodevices.

BACKGROUND AND SUMMARY OF THE INVENTION

Nanotechnology is commonly defined as the construction and utilization of functional structures with at least one region or characteristic dimension measured in nanometers. Such structures will be hereinafter referred to as nanodevices. The potential applications of nanotechnology are pervasive and the expected impact on society is huge. IC manufacturing technology has already arrived at sub-100 nm technology, while the fabrication of even smaller structures has already been demonstrated on a laboratory scale.

The basic building blocks of nanodevices are nanoparticles or nanostructures, such as carbon nanotubes (CNTs), quantum dots, or spherical fullerenes. A carbon nanotube comprises a graphene sheet (sheet-like structure of hexagonal network of carbon atoms) rounded into a hollow cylindrical form and can be single-walled or multi-walled. A quantum dot (or semiconductor nanocrystal) is a particle of matter in which addition or removal of an electron changes its properties in some useful way. Spherical fullerenes (also called buckyballs) are carbon molecules made up of 60 carbon atoms arranged in a series of interlocking hexagons and pentagons, forming a structure that looks similar to a soccer ball.

Assembly of nanoparticles or nanostructures into nanodevices presents significant problems, however, because the individual components or subunits are very small. Manipulation of individual nanoparticles, even when possible, is slow and tedious. There are a number of known techniques for creating various nanoparticles and for combining nanoparticles with other nanoparticles or with conventional materials to create functional nanodevices. Unfortunately, these techniques are better suited for use in laboratories than for large-scale mass-production of nanodevices.

For example, CNTs are one of the most widely utilized nanoparticles. CNTs exhibit extraordinary strength, flexibility, and unique electrical properties, and are efficient conductors of heat, making them suitable for applications ranging from AFM and STM tips, to nano-scale transistors, to reinforcing composite polymers. CNTs also make excellent field emission electron sources for use in flat-panel displays, microwave amplifiers, electron beam lithography devices, and electron microscopes.

A typical field-emitting device comprises a field-emitting assembly composed of a cathode and a plurality of field emitter tips. The device also typically includes a grid spaced relatively closely to the emitter tips and an anode spaced relatively farther from the tips. Voltage induces emission of electrons from the tips, through the grid, toward the anode. Applications include microwave tube devices, flat panel displays, klystrons and traveling wave tubes, ion guns, electron beam lithography, high-energy accelerators, free electron lasers, and electron microscopes and microprobes.

Most high-resolution electron microscopes use a specially prepared heated metal (Zr/O/W) tip as an electron source. These sources have a relatively large energy spread of the emitted electrons, which negatively impacts the resolution of the microscope. An electron source based on cold field emission has a lower energy spread. Referred to as a field emission gun, this source uses a very high electric field to pull electrons out of a very sharply pointed tungsten or other metallic tip. It is very difficult to obtain a stable electron current from such tips except in extremely good vacuum because of contamination, shape changes due to surface migration of the metal atoms, and the unavoidable bombardment by ions that are created when an electron beam is drawn from the source.

Figure 1:
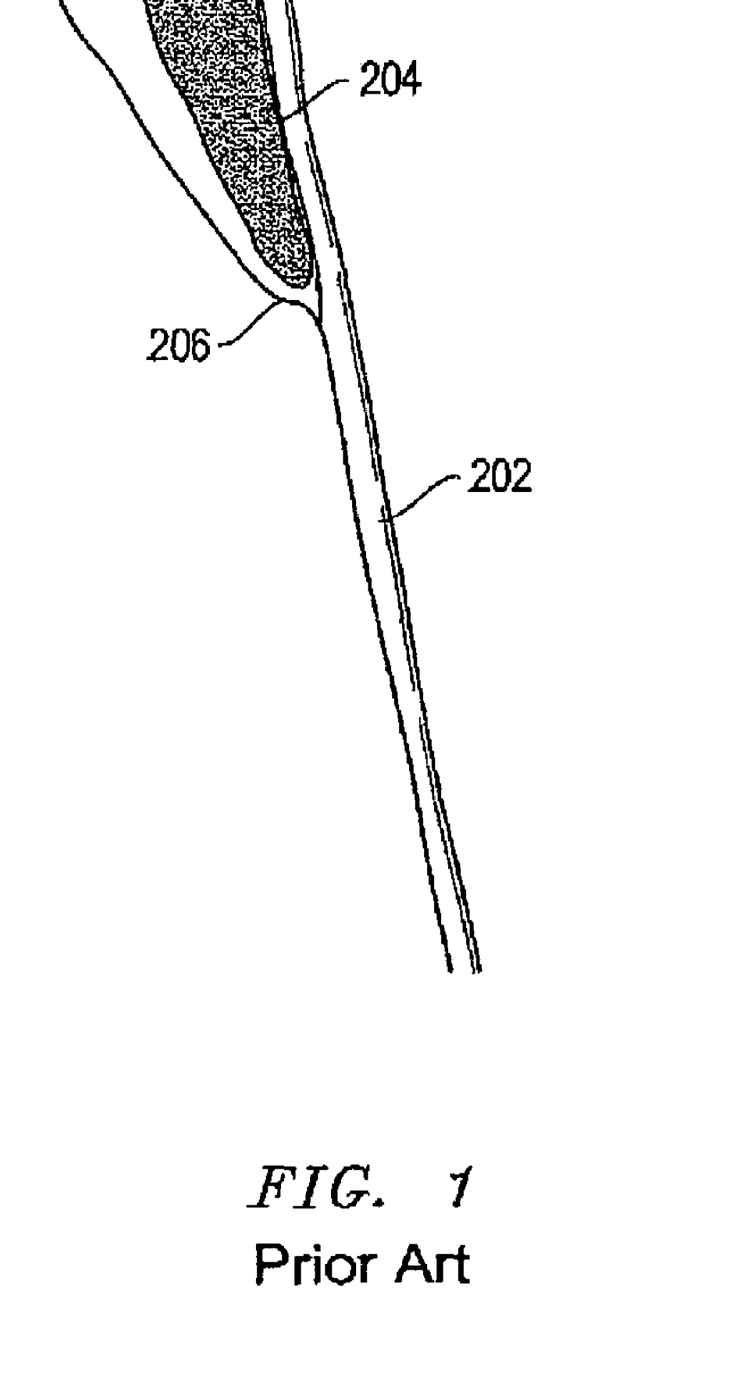
FIG. 1 shows a prior art electron source using a CNT.

Carbon nanotubes are attractive as cold field emitters because they have the required sharp tip by nature and have shown excellent emission stability. The structure of carbon nanotubes is more resistant to ion bombardment, more resistant to contamination (because of the low sticking coefficient of the CNT structure), and can better withstand the strong electric field required for emission than metal tips. An electron beam drawn from the extremely small apex of the carbon nanotube has a high current density and a small energy spread. This can be exploited to increase the resolution of electron microscopes considerably. FIG. 1 is a line drawing of an individual carbon nanotube 202 mounted on a tungsten tip 204 and fixed in place by glue 206.

An overview of CNT electron sources is presented by de Jonge, et al. in "Carbon nanotube electron sources and applications," *Phil. Trans. R. Soc. Lond.* A 362, 2239-2266(2004). CNT electron sources have been made by mounting individual carbon nanotubes directly onto a tungsten tip. Unfortunately, existing methods have a number of problems that make it difficult to reliably produce large numbers of CNT electron sources.

There are a number of known methods of producing CNTs, including carbon-arc discharge, laser ablation of carbon, or chemical vapor deposition (CVD). The CNTs are typically grown in the form of randomly oriented, needle-like or spaghetti-like agglomerates that are not easily or conveniently incorporated into individual field emitter devices. It is often difficult and time consuming to extract a single CNT for mounting. CVD can be used to grow single CNTs in a predetermined location as described by Ren et al. in "Growth of a single freestanding multiwall carbon nanotube on each nanonickel dot," *Applied Physics Letters*, vol. 75, no. 8, 23 Aug. 1999, pp. 1086-1088, but those CNTs tend to be tightly bonded to the catalyst layer and are difficult to remove.

Further, when a single CNT is isolated, it must still be mounted on the support structure, typically by using micromanipulators and an optical or electron microscope to position the CNT and either relying on van der Waals forces alone or using an adhesive to hold the tip in place. Whatever method is used, the adhesion of CNTs to a substrate is generally a weak bond. Therefore, the CNTs have a tendency to be pulled off of the substrate at elevated electric fields. These methods often limit the maximum temperature to which the CNT can be heated, thereby limiting the post-mounting processing that can be done.

Another way to produce CNT electron sources is to grow the CNT directly on the tungsten tip by depositing a catalyst onto the tip and using CVD techniques. This method presents many challenges and difficulties and requires significant additional research before a single CNT can be grown in a repeatable fashion.

What is needed is an improved method of manufacturing certain nanodevices, including CNT electron sources, so that they can be mounted into a macroscopic device in a repeatable, reliable manner suitable for large-scale mass production.

SUMMARY OF THE INVENTION

It is an object of the invention, therefore, to provide an improved method of manufacturing certain nanodevices so that they can be fabricated and mounted into a macroscopic device in a repeatable, reliable manner suitable for large-scale mass production.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF PREFERRED EMBODIMENTS

Preferred embodiments of the present invention are directed to methods and an apparatus for fabricating a batch of nanoparticles or nanodevices using established photolithographic techniques. Nanoparticles can be grown on macroscopic "modules" which can be easily manipulated and shaped to fit standard mounts in various macroscopic devices. A wide variety of electrical and mechanical connections can be incorporated into the macroscopic modules to provide an appropriate interface between various devices and the nanoparticle or nanodevice. Embodiments of the present invention can make use of well-developed techniques to grow nanoparticles, such as a carbon nanotubes, nanowires, quantum dots, or quantum wires, in a defined array on a silicon wafer or other suitable substrate.

In some embodiments of the invention, photolithographic techniques are used to manufacture the nanoparticle substructure in a manner suitable for large-scale mass production. Photolithography has been used for decades in the fabrication of integrated circuits. As a result, the processes involved have been refined to levels of reliability far beyond those seen with other less common techniques. Batch fabrication contributes directly to low manufacturing costs by allowing thousands of structures to be fabricated simultaneously on the surface of a wafer. The use of materials common to IC production also results in a significant reduction in manufacturing costs because the materials are so widely available. The reliability and repeatability of modern photolithography techniques are especially valuable in the production of nanostructures because the margins of error are so small. For example, electron emission properties can vary widely with any variation in structure (width, length, etc.) of a CNT electron source. The high reproducibility of mass production techniques using photolithography reduces variations between different CNT emitters.

In other embodiments of the present invention, mounted nanodevices are fabricated as macroscopic mini-modules, allowing nano-scale structures to be more easily mounted and utilized. This allows the user to take advantage of the behavior unique to the nanoparticles or nanodevices without the limitations of prior art methods of fabricating and mounting nanoparticles.

In a preferred embodiment of the present invention, well-known photolithographic techniques can be used to assemble large numbers of CNTs on a silicon wafer, which can be divided into a number of macroscopic modules, each with one functional CNT suitable for use as an individual electron emitter or an array of electron emitters. These CNT modules can be easily mounted in a device such as an electron beam system by using a standard mounts such as a mini-Vogel mount. The present invention thus combines the use of existing Si wafer level techniques, which allow mass-production of large numbers of CNTs, with a method that allows the CNTs to be easily handled and mounted into a device such as an electron column. In other embodiments, similar techniques can be used to manufacture other types of nanodevices for use in other types of macodevices.

As referred to herein, the terms "nanoparticles," "nanostructures," and "nanocomponents" are intended to refer to functional structures with at least one region or characteristic dimension measured in nanometers (typically 500 nm or less) and are not intended to be mutually exclusive. As used herein, a "nanodevice" is any device containing a functional element (in other words a device having a functionality) with at least one region or characteristic dimension of the device measured in nanometers. A nanodevice may be used by or as part of an ordinary macroscale device, such as an electron-beam system or atomic force microscope, in order to interact with materials at a nano-level. The term "carbon nanotube" or "nanotube" refers a structure at least partially having a cylindrical structure mainly comprising carbon. Although much of the following description is directed toward the fabrication of CNT electron emitters, the methods of the present invention are equally applicable to the fabrication of any nanostructure or nanodevice. Hence, the scope of the present invention should not be limited to the specific embodiments discussed herein.

Figure 2:
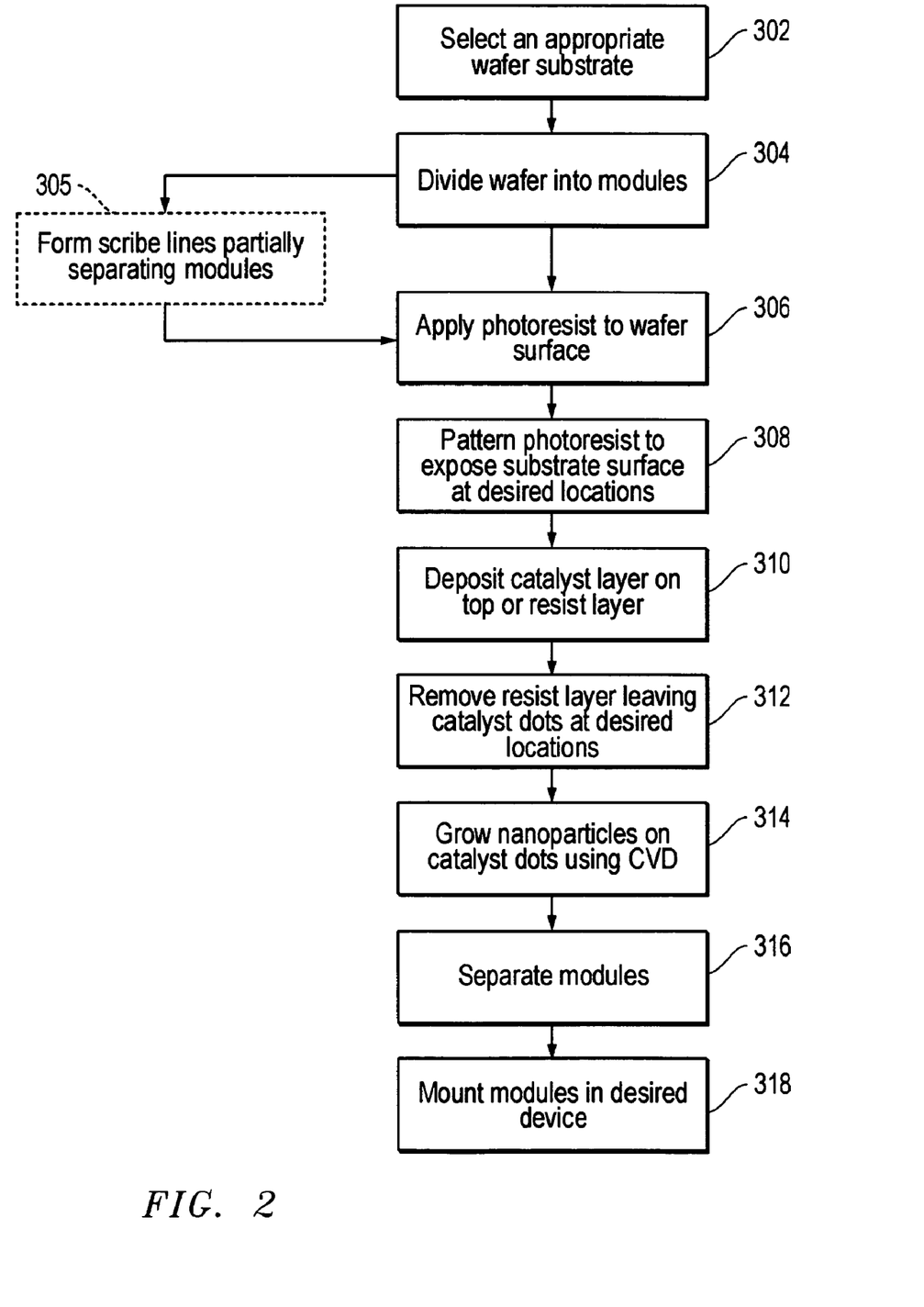
FIG. 2 is a flowchart showing the steps of fabricating a batch of nanodevices according to a preferred embodiment of the present invention.

FIG. 2 is a flowchart showing the steps of fabricating a batch of nanodevices according to a preferred embodiment of the present invention.

First, in step 302, an appropriate substrate wafer is selected. In a preferred embodiment, a silicon wafer is used, but other substrate materials can be used, including glass, ceramics, metals, sapphire, semiconductor materials, or any other material that is capable of withstanding the required growth temperature or conditions for the desired nanoparticle. The substrate can also include one or more layers of an insulating material such as silicon dioxide ($SiO_2$) or silicon nitride (SiN). Further, the substrate can include multiple material layers formed using known lithographic techniques to provide control electronics or other circuitry, which are not shown in this embodiment for simplicity.

The wafer can be of any desired thickness, depending upon the particular mounting method that will be employed. For example, as discussed in greater detail below, a preferred embodiment of the present invention can be used to fabricate CNT electron emitters that can be easily mounted into a standard mini-Vogel mount (MVM) in an electron beam system. In this embodiment, a wafer with a thickness of 800 μm is preferred because it will fit into the standard MVM mount.

Figure 3A:
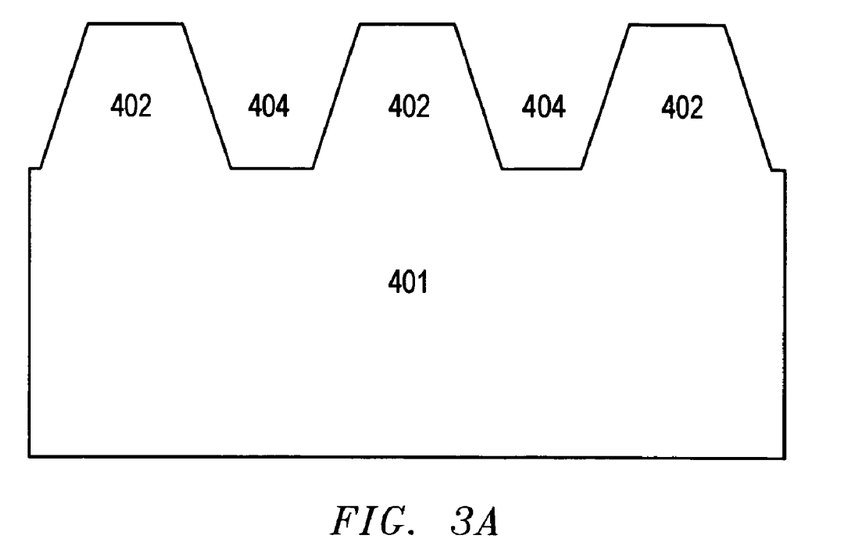
FIG. 3A shows a cross section of an etched silicon wafer according to the present invention.

In step 304, the surface of the wafer is divided into a number of sections or "modules," by defining module boundaries. Each defined module will preferably include at least one site where the growth of a nanoparticle is desired. Modules can be of any shape suitable for mounting in any desired prior art macro-scale holder, socket, or other standard mount in a device or instrument. The surface of the substrate can optionally be physically patterned in step 305 by etching or cutting grooves or lines into the substrate surface thus forming a number of module "caps" rising above the etched lines as illustrated in FIG. 3A. These etched lines serve to delineate the separate modules that will be formed and make it easier to separate the modules after the nanoparticles are formed. The etched lines can be formed using any appropriate known method including photolithographic etching, cutting with a diamond dicing saw, or milling with a charged particle beam or laser. Alternatively, the surface of the wafer could be divided into virtual modules with the actual separation of each module occurring after the desired nanoparticles are formed.

Once the substrate surface has been divided into appropriately shaped modules and the desired nanoparticle locations determined, nanoparticles or nanodevices can be grown on each module using any known growth technique. In step 306, the substrate surface can be spin-coated with a photoresist. Any suitable resist may be applied. For example, if the resist will be patterned using e-beam lithography, an e-beam resist such as polymethylmethacrylate (PMMA) may be used. Other resists may be used when other types of lithography techniques will be used to pattern the resist. Other types of suitable lithographic patterning techniques include e-beam lithography, UV lithography, deep UV (DUV) lithography, extreme UV (EUV) lithography, ion beam lithography, laser-based techniques, and x-ray lithography.

In this embodiment, the resist is applied and patterned before the catalyst layer is applied. Skilled persons will recognize that in some circumstances it will be desirable to deposit the catalyst before the resist and to pattern the catalyst with metal etching techniques.

After the resist is deposited, in step 308, an appropriate method is used to pattern the resist. In a preferred embodiment, the resist is exposed to a radiation source through a mask to form a pattern on the resist surface. The exposed resist layer is then developed and a portion of the resist layer removed leaving desired areas of the substrate exposed and other areas covered with resist. In this embodiment, the exposed areas should correspond with the desired locations for the desired nanoparticles. The size of the desired opening in the resist will vary with the desired size for the catalyst sites.

In step 310, an appropriate catalyst layer is then deposited on top of the resist layer so that it fills the patterned holes in the resist. The catalyst layer may include one or more of a variety of catalyst materials, including nickel, iron, or cobalt. Various known deposition techniques can be employed, including ion sputtering, electron beam evaporation, and inductive heating evaporation.

In step 312, a resist solvent can then be used to remove the resist layer, along with the catalyst material deposited on top of the resist, leaving only the catalyst deposited on the substrate at the bottom of the holes in the resist. In this manner, catalyst dots of a desired size can be formed at any desired locations on the substrate.

Once catalyst dots have been formed at the desired locations, in step 314, an appropriate growth technique can be employed to grow a nanoparticle at the desired location. For example, various CVD techniques can be used to grow single walled CNTs, usually by reacting a carbon-containing gas (such as acetylene, ethylene, ethanol, etc.) with the catalyst at temperatures above 600° C. Appropriate growth techniques can include plasma enhanced CVD, thermal chemical CVD, alcohol catalytic CVD, vapor phase growth, aero gel-supported CVD and laser-assisted CVD.

After the desired nanoparticles have been formed on each of the substrate modules, in step 316, the modules can be separated by various known wafer-cleaving techniques. Modules can either have an attached single nanoparticle or an array of nanoparticles. The macroscopic modules with attached nanoparticles or nanodevices can then be easily mounted into the desired device or instrument in step 318.

FIG. 3A through FIG. 3G illustrate the steps in fabricating a large number of CNT electron emitters suitable for mounting in the standard mini-Vogel mount used by a number of electron beam systems.

Figure 4:
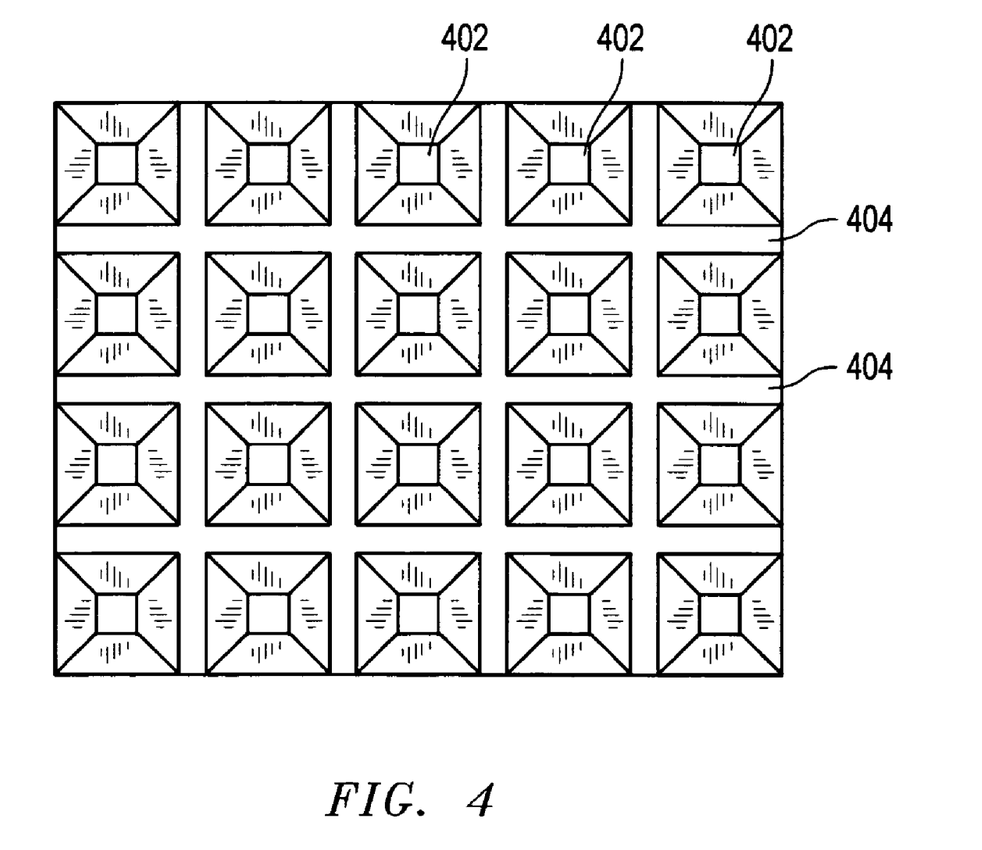
FIG. 4 shows the patterned substrate of FIG. 3A from a top down view.

FIG. 3A shows a preferred embodiment of the present invention where a silicon wafer 401 has been patterned into a number of raised sections or module caps 402, each module cap generally shaped like a truncated pyramid with a flat upper surface, by etching lines 404 into the wafer surface. Lines 404 can be formed by any known photolithography techniques or by other suitable techniques such as milling or sawing. FIG. 4 shows the patterned substrate of FIG. 3A from a top down view. In the embodiment of FIG. 3A and FIG. 4, the dimensions at the base of the module caps are preferably approximately 500 μm ×700 μm. In the preferred embodiment of FIG. 3A, the module caps have a raised height of 30 to 50 μm (above the bottom of the etched lines).

Figure 3B:
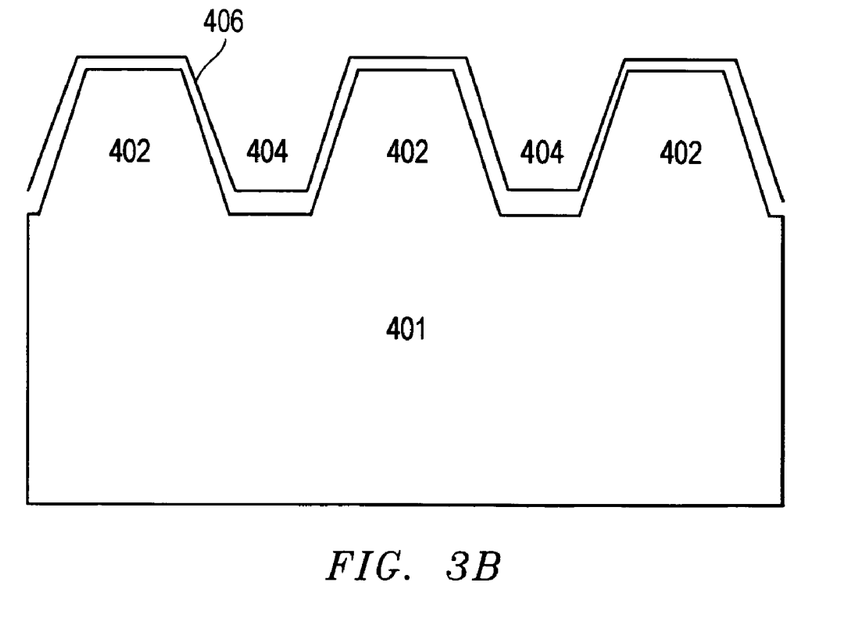
FIG. 3B shows a cross-section of the wafer of FIG. 3A after the substrate has been coated with a layer of a photoresist.
Figure 3C:
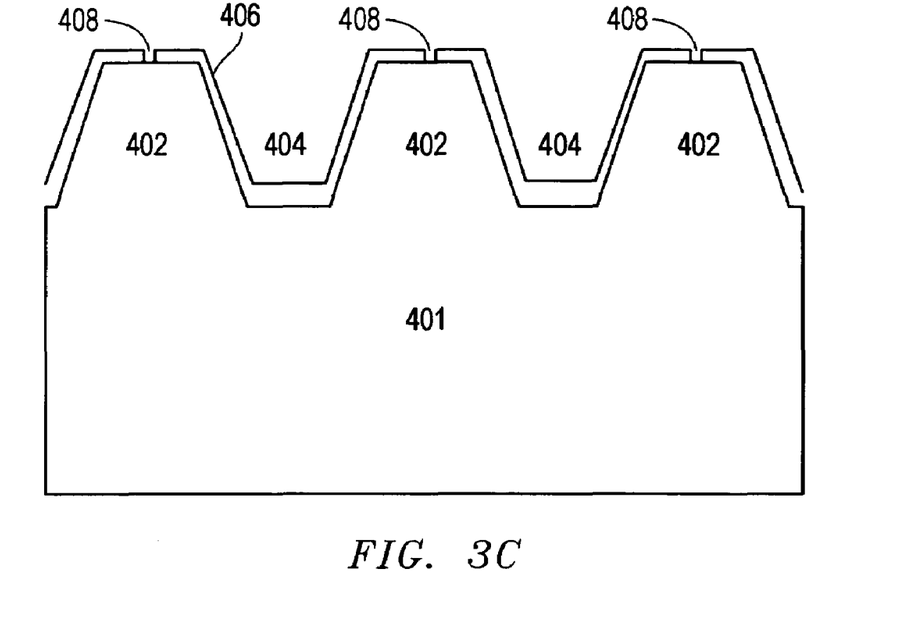
FIG. 3C shows a cross-section of the wafer of FIG. 3B where the photoresist has been patterned using standard lithographic techniques.

FIG. 3B shows the wafer of FIG. 3A after the substrate has been coated with a layer of a photoresist. In FIG. 3C, the photoresist has been patterned using standard lithographic techniques. This patterning has resulted in one hole 408 in the resist exposing the substrate on the upper surface of each raised module. The size of the desired opening in the resist will vary with the desired size for the catalyst sites. In the preferred embodiment of FIG. 3C, the holes in the resist are approximately 5-10 nm in diameter.

Figure 3D:
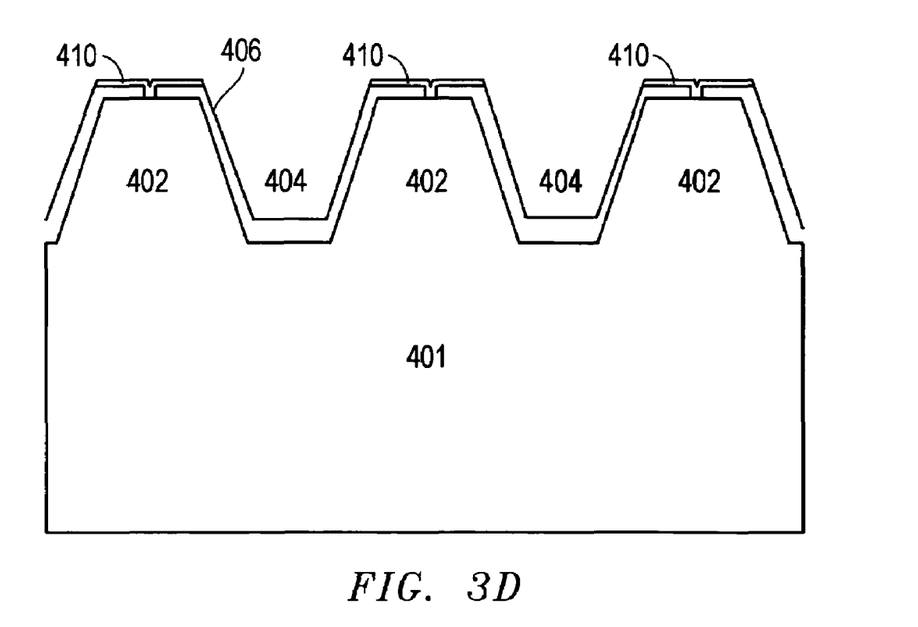
FIG. 3D shows a cross-section of the wafer of FIG. 3C where a catalyst layer has been deposited over the resist on the upper surface of each raised module.
Figure 3E:
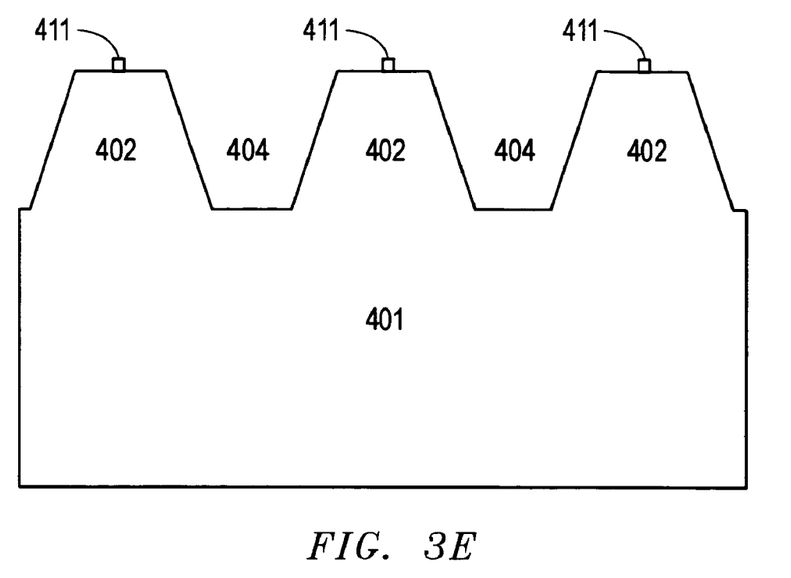
FIG. 3E shows the embodiment of FIG. 3D after a wash with a resist solvent has removed the resist layer, leaving only the catalyst deposited on the substrate at the bottom of the holes in the resist.

In FIG. 3D, a nickel catalyst layer 410 has been sputter-deposited over the resist on the upper surface of each raised module cap. FIG. 3E shows the embodiment of FIG. 3D after a wash with a resist solvent has removed the resist layer, along with the catalyst material deposited on top of the resist, leaving only the nickel catalyst deposited on the substrate at the bottom of the holes in the resist. In the preferred embodiment of FIG. 3E, one catalyst dot 411 has been formed on the upper surface of each substrate module cap. Skilled persons will recognize that the catalyst can be deposited at the desired location by a number of other suitable methods, including deposition or a direct write with a charged particle beam.

Figure 3F:
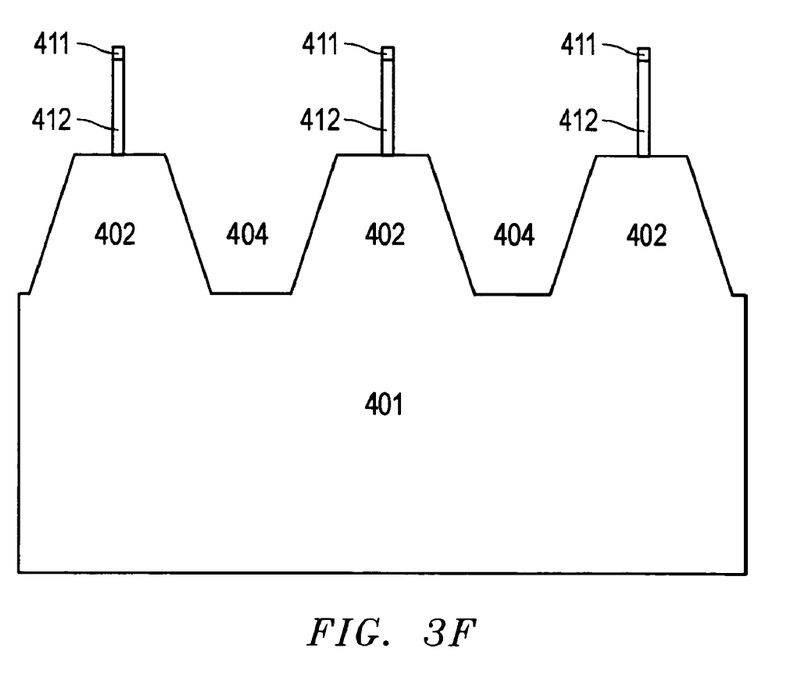
FIG. 3F shows a cross-section of the wafer of FIG. 3E where one carbon nanotube has been grown on each catalyst dot.

FIG. 3F, one carbon nanotube 412 has been grown on each nickel catalyst dot. In the preferred embodiment of FIG. 3F, only one CNT is grown on the upper surface of each raised module. Either single-walled CNTs or multi-walled CNTs can be grown. In some cases, the nickel catalyst dot may be on top of the CNTs after the growth process is completed. Skilled persons will recognize that it may be desirable to remove the nickel catalyst dots from the CNT tips using known techniques.

Figure 3G:
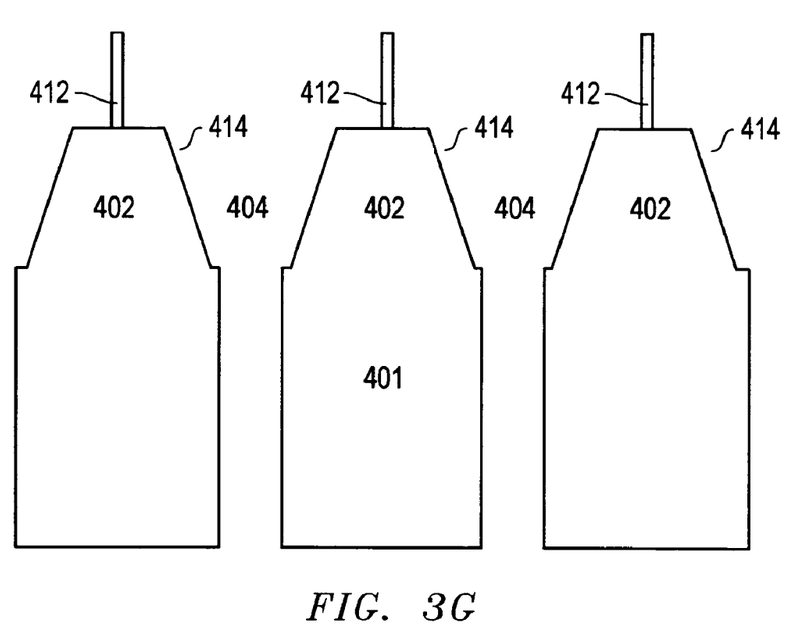
FIG. 3G shows a cross-section of the wafer of FIG. 3F after the modules have been separated.

In FIG. 3G, the CNT modules 414 have been separated generally along the etched lines 404, preferably by using a diamond dicing saw or laser. Each of the CNT modules 414 shown in FIG. 3G comprises a substrate base (with a pyramid shaped module cap) and one functional CNT (attached to the upper surface of the module cap) suitable for use as an electron emitter. In the embodiment of FIG. 3A and FIG. 4, the lateral dimensions of the substrate base are preferably approximately 500 μm×700 μm. Skilled persons will recognize that modules can be formed with any dimensions or shape suitable for mounting in a desired device or instrument (as discussed below). However, modules that have a dimension smaller than 10 μm may be more difficult to manipulate or mount. The macroscopic size of the modules, roughly 500×700×800 μm (the height of the module is determined by the thickness of the Si wafer) in this preferred embodiment, make them relatively easy to manipulate. Large batches of functional nanodevices, in this case CNT electron emitters, can be simultaneously fabricated using this method.

Figure 5:
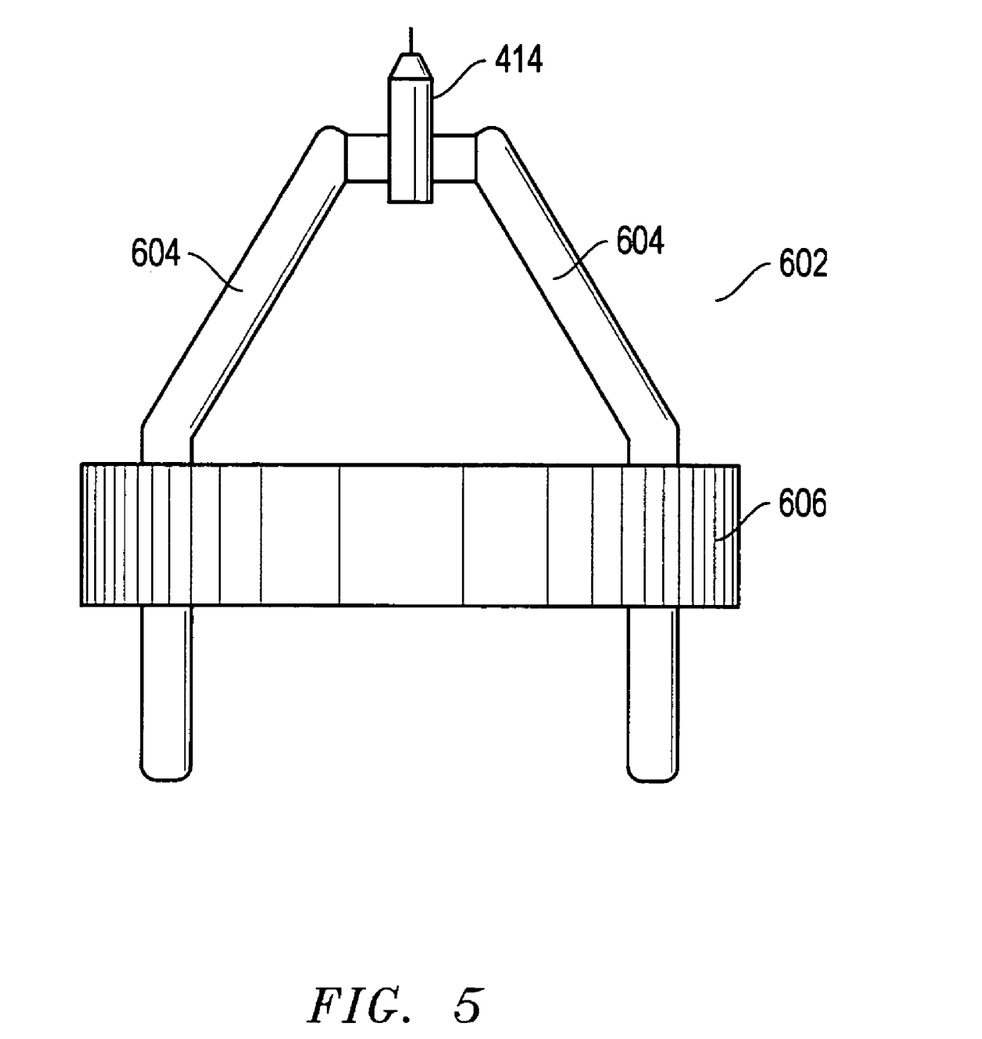
FIG. 5 shows a schematic representation of one of the modules of FIG. 3G mounted in a mini-Vogel mount.

The modules 414 shown in FIG. 3G are suitable for mounting into a mount that uses a clamping force to hold the base of the module in place. One such clamping type mount is a typical mini-Vogel mount used in many electron beam systems. MVM mounts are available, for example, from Applied Physics Technologies of McMinnville, Oreg. A typical MVM 602 is shown in FIG. 5. MVMs are typically used in electron beam systems using Lanthanum hexaboride (LaB6) and cerium hexaboride (CeB6) thermionic cathodes. In the typical MVM, twin posts 604 are rigidly fixed in a thick ceramic base 606, and bent towards the center in an inverted "V". The posts are preferably made of a molybdenum-rhenium alloy or other material that maintains a high modulus of elasticity even at high temperatures. The posts can be spread slightly to accommodate the CNT modules 414 shown in FIG. 3G. When the posts are released, the modules will be held in place by the clamping force of the posts.

Mounting the CNT modules using a MVM has a number of added advantages. First, it makes it relatively easy to mount the module into a macro-scale device such as an electron beam system. It also makes it easy to replace the electron emitter if it fails. Further, the use of a MVM allows the entire CNT module to be heated to high (>1800K) temperatures for cleaning and post-growth processing of the CNT. Typically, CNTs grown using CVD need to be heated to their melting point, in order to form a well-structured capped end-form and produce much more favorable electron emission properties. The MVM also allows for good electrical conductivity to the CNT, especially where electrical contacts are formed as a part of the module substrate. Other types of post-growth "activation" may be required, including passing an electrical current through the nanoparticle or exposing the nanoparticle to certain chemicals.

Figure 6:
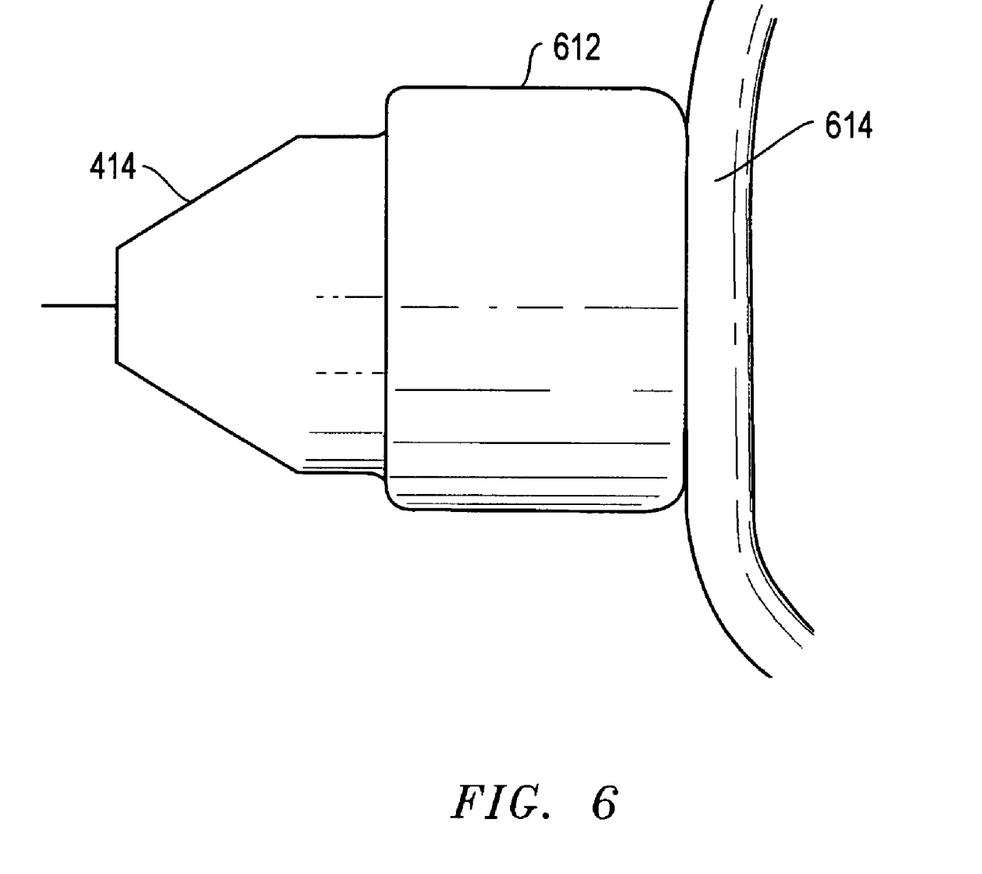
FIG. 6 shows a schematic representation of one of the modules of FIG. 3G mounted in a cup mount.

In another preferred embodiment, modules could be shaped to fit into a number of other standard "socket-type" mounts commonly found in charged particle beam systems. For example, FIG. 6 shows a cup-type mount commonly used with LaB6 crystals in electron beam systems. The metallic cup 612 is typically composed of Rhenium or a similar material. In this example, the opening of the cup is circular in shape, although any desired shape could be used (square, oval, etc.). Cup 612 is spot welded to a filament, typically composed of tungsten or rhenium, which is attached to posts on ceramic base (not shown). The CNT module of the present invention can preferably be shaped (using known photolithographic or other techniques) to tightly fit into cup 612. Alternatively, the module could be held in place by a braze material or adhesive.

Figure 7:
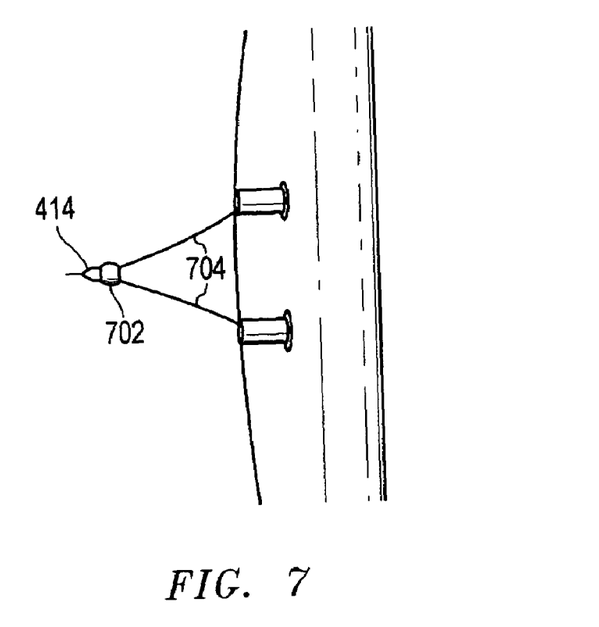
FIG. 7 shows a schematic representation of one of the modules of FIG. 3G mounted in a Denka mount.

FIG. 7 shows another socket-type mount commonly known as a Denka mount. In this mount, a U-shaped metal holder 702 is spot welded to filaments 704. According to the present invention, a CNT module 414 could be shaped to fit into the U-shaped holder and held in place by a braze material deposited onto the holder and the base of the module.

Figure 8:
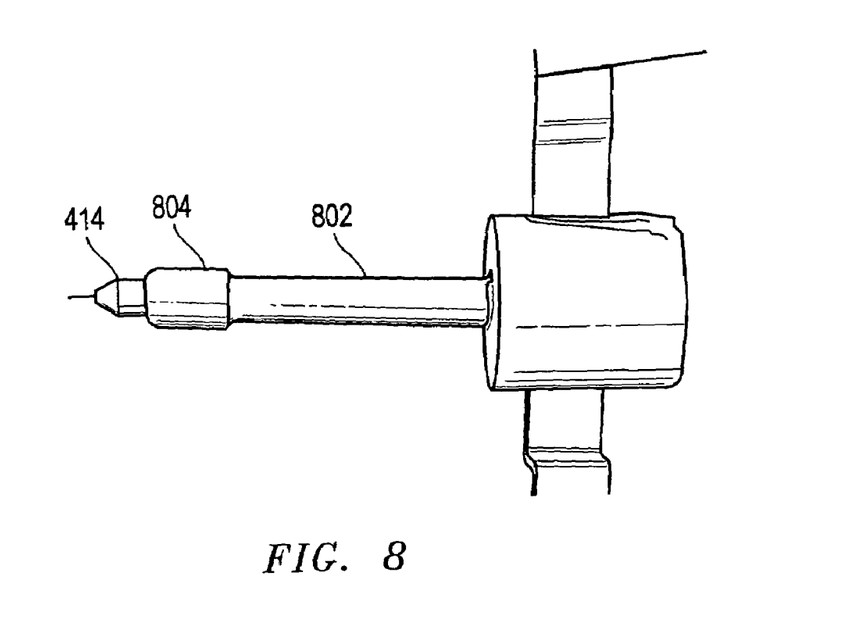
FIG. 8 shows a schematic representation of one of the modules of FIG. 3G mounted in a LaB6 crystal mount

FIG. 8 shows another LaB6 crystal mount produced by Kimball Physics of Wilton, N.H. This mount is designed to accommodate a LaB6 crystal that is shaped like an inverted "T." The crystal is placed on heater rod 802 and then ferrule 804 is pushed over the crystal. The ferrule press fits tightly onto heater rod 802 while a lip on the top of ferrule 804 holds the base of the crystal in place. According to the present invention, the base of a module 414 could be shaped to fit the Kimball mount so that the superior CNT electron emitter could be easily used by the electron beam system. Alternatively, a module according to the present invention with a different functional nanoparticle (or combination of nanoparticles) could also be mounted using any of these known mounts.

In another preferred embodiment, CNTs could be grown on a substrate according to the present invention so that the resulting CNT module could be used as chemical "noses" capable of detecting various chemicals in the atmosphere based on change in the CNT's electrical properties induced by exposure to the chemical. In this embodiment, multiple CNTs could preferably be grown on each module. Multiple contact lines could be formed within the module substrate allowing for multiple electrical connections between the outside of the module and individual CNTs or groups of CNTs.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention.

We claim as follows:

1. A method of fabricating a nanodevice, the method comprising:
    defining a plurality of module boundaries on a substrate surface;
    forming a nanoparticle on the substrate surface within two or more of said module boundaries, said nanoparticle having functionality;
    separating the substrate into sections along a plurality of said module boundaries to form at least two modules separated from each other, each of the at least two modules comprising a substrate base with one attached functional nanoparticle; and
    mounting the base of at least one module into a device capable of making use of the functionality of said functional nanoparticle, said base held in place in the device by way of a mechanical clamping force exerted on the base.

2. The method of claim 1 further comprising subjecting the one attached functional nanoparticle to post growth processing by heating said functional nanoparticle after the base has been mounted into said device.

3. The method of claim 1 further comprising activating the one attached functional nanoparticle by electrical or chemical means after the base has been mounted into said device.

4. The method of claim 1 in which forming a nanoparticle on the substrate surface comprises:
    depositing a catalyst layer onto the substrate surface within two or more of said module boundaries, said catalyst layer comprising a material capable of catalyzing the growth of a nanoparticle having a functionality; and
    growing a nanoparticle on the catalyst layer within two or more of said module boundaries in a process catalyzed by said material.

5. The method of claim 4 in which depositing a catalyst layer onto the substrate surface comprises:
    depositing a resist layer onto the substrate surface within two or more of said module boundaries;
    patterning the resist layer to expose the substrate surface at desired locations within said module boundaries;
    applying a catalyst layer over the patterned resist layer and exposed substrate surface;
    removing the resist layer and the catalyst overlying the resist layer and leaving the catalyst layer overlying the substrate at said desired locations within the module boundaries.

6. The method of claim 5 in which depositing a catalyst layer onto the substrate surface further comprises:
    depositing an insulating layer over the catalyst layer; and
    patterning the insulating layer to expose the catalyst layer at desired locations within said module boundaries.

7. The method of claim 1 in which the substrate comprises a silicon wafer.

8. The method of claim 1 in which the substrate comprises glass, ceramic, metal, or sapphire.

9. The method of claim 1 in which the nanoparticle is a nanotube, nanorod, nanowire, or quantum dot.

10. The method of claim 1 in which the nanoparticle is a single-walled carbon nanotube or a multi-walled carbon nanotube.

11. The method of claim 1 in which said functionality comprises an electron emission function.

12. The method of claim 11 in which said device comprises an electron beam system.

13. The method of claim 11 in which said device comprises a charged particle beam system.

14. The method of claim 1 in which said functionality comprises a chemical sensor function.

15. The method of claim 1 in which the said base of at least one module is mounted using a mini-Vogel mount.

16. The method of claim 1 in which the substrate comprises an insulating material and a pattern of electrically conductive material.

17. The method of claim 16 in which the pattern of electrically conductive material forms at least one electrical connection between the attached nanoparticle and an electrical contact on at least one edge of the substrate base.

18. The method of claim 17 in which mounting the base of at least one module into a device capable of making use of the functionality of said functional nanoparticle further comprises making an electrical connection between the device and said electrical contact.

19. The method of claim 1 in which the substrate base comprises a section of substrate capable of being manipulated in a macroscale environment.

20. A method of fabricating a nanodevice, the method comprising:
    defining a. plurality of module boundaries on a substrate surface;
    forming a nanoparticle on the substrate surface within two or more of said module boundaries, said nanoparticle having a functionality;
    separating modules along a plurality of said module boundaries so that at least two modules we separated from each other, each of the at least two modules having a base and only one attached functional nanoparticle and each base being suitable for mounting the module into a macroscopic device utilizing the functionality of said attached nanoparticle, said mounting accomplished by way of a force exerted on the base.

21. The method of claim 20 in which said force is exerted on the base by mechanical clamping, welding, brazing, or chemical adhesive.

22. A method of fabricating a nanodevice, the method comprising:
    forming a plurality of nanoparticles on a substrate surface, at least two of said nanoparticles having a functionality;
    separating the substrate into two or more sections, each section having at least one attached functional nanoparticle;
    mounting at least one section into a macro-scale device, said mounting accomplished by a mechanical clamping force exerted onto said substrat6 section, said mounting providing an electrical connection between said macro-scale device and said substrate section, and said macro-scale device utilizing the functionality of the at least one attached nanoparticle.

23. The method of claim 22 in which separating the substrate into two or more sections, each section having at least one attached functional nanoparticle comprises separating the substrate into two or more sections, each section having an array of attached functional nanoparticles.

24. A method of fabricating a nanodevice, the method comprising:
    patterning a substrate to defining a plurality of modules having a uniform size and shape;
    depositing a catalyst layer onto the substrate surface within two or more of said module boundaries, said catalyst layer comprising a material capable of catalyzing the growth of a nanostructure having a functionality;

forming a predetermined catalyst pattern on the substrate surface within two or more of said module boundaries;

growing a plurality of nanostructures having a functionality at the exposed surfaces of the catalyst pattern using chemical vapor deposition in a process catalyzed by said material;

separating said modules along a plurality of said module boundaries so tat at least two modules are separated from each other, each of the at least two modules having a base and at least one attached nanostructure;

mounting the base of at least one module into an environment capable of utilizing the functionality of said attached nanostructure; and subjecting the at least one attached nanostructure to post growth processing by heating said nanostructure after the base has been mounted into said environment.

25. The method of claim 24 in which patterning a substrate comprises forming a pattern of grooves in the substrate surface dividing the substrate surface into a plurality of raised modules which are generally pyramid shaped.

26. The method of claim 24 in which the substrate is 300 to 800 μm in thickness.

27. The method of claim 24 in which the defined modules have a width greater than 10 μm.

28. The method of claim 24 in which subjecting the at least one attached nanostructure to post growth processing by heating said nanostructure comprises heating the nanostructure to a temperature of at least 1800 K.

29. A method of fabricating an electron emitting device, the method comprising:

defining a plurality of module boundaries on a substrate surface;

forming a carbon nanotube on the substrate surface within two or more of said module boundaries;

separating the substrate into sections along a plurality of said module boundaries to form at least two modules separated from each other, each of the at least two modules comprising a substrate base with one attached carbon nanotube; and mounting the base of at least one module into an electron beam system by using a mini-Vogel Mount.

30. An apparatus for producing an electron beam comprising:

an electron beam system with a standard mini-Vogel mount;

an appropriately shaped substrate section mounted in the standard mini-Vogel mount; and at least one carbon nanotube grown on the substrate section.

31. A method of fabricating a nanodevice, the method comprising:

defining a plurality of module boundaries on a substrate surface, said boundaries defining dimensions of at least two macroscopic modules;

forming a nanoparticle on the substrate surface within two or more of said module boundaries, said nanoparticle having a functionality; and after said nanoparticle have been formed on the substrate surface, separating the substrate into sections along a plurality of said module boundaries to form at least two modules separated from each other, each of the at least two modules comprising a substrate base with one attached functional nanoparticle, each substrate base having a minimum dimension which is macroscopic in scale.

32. The method of claim 31 further comprising mounting the base of at least one module into a device capable of making use of the functionality of said functional nanoparticle, said base held in place in the device by way of a mechanical clamping force exerted on the base.

33. The method of claim 31 in which forming a nanoparticle on the substrate surface comprises:

depositing a catalyst layer onto the substrate surface within two or more of said module boundaries, said catalyst layer comprising a material capable of catalyzing the growth of a nanoparticle having a functionality; and growing a nanoparticle on the catalyst layer within two or more of said module boundaries in a process catalyzed by said material.

34. The method of claim 32 in which the said base of at least one module is mounted using a mini-Vogel mount.

35. An apparatus for producing an electron beam comprising:

an electron beam system with a standard mini-Vogel mount;

an appropriately shaped module comprising a substrate section, said module mounted in the standard mini-Vogel mount; and at least one functional nanoparticle formed on the module according to the method of claim 31.

* * * * *